(12) United States Patent
Shirota et al.

(10) Patent No.: US 6,310,020 B1
(45) Date of Patent: Oct. 30, 2001

(54) STRIPPING COMPOSITION FOR RESIST

(75) Inventors: Mami Shirota; Kozo Kitazawa; Eiji Kashihara; Eiji Nagoshi, all of Wakayama (JP)

(73) Assignee: Kao Corporation, Tokyo (JP)

( * ) Notice: Subject to any disclaimer, the term of this patent is extended or adjusted under 35 U.S.C. 154(b) by 0 days.

(21) Appl. No.: 09/426,183

(22) Filed: Oct. 25, 1999

(30) Foreign Application Priority Data

Nov. 13, 1998 (JP) .................................................. 10-324107
Jan. 22, 1999 (JP) .................................................. 11-014677

(51) Int. Cl.$^7$ ....................................................... C11D 7/26
(52) U.S. Cl. ............................................ 510/176; 430/331
(58) Field of Search ............................... 510/176; 430/331

(56) References Cited

U.S. PATENT DOCUMENTS 5,759,973 * 6/1998 Honda et al. ........................ 510/176
5,905,063 * 5/1999 Tanabe et al. ........................ 510/176
5,994,172 * 11/1999 Ohtani et al. ........................ 438/151

FOREIGN PATENT DOCUMENTS

A4361265   12/1992   (JP) .
A7037846    2/1995   (JP) .
A7219240    8/1995   (JP) .

* cited by examiner

*Primary Examiner*—Hoa Van Le
(74) *Attorney, Agent, or Firm*—Birch, Stewart, Kolasch & Birch, LLP

(57) ABSTRACT

A stripping composition for a resist comprising a polycarboxylic acid and/or a salt thereof, and water, wherein a pH of the stripping composition is less than 8; and a stripping composition for a resist comprising 0.01 to 90% by weight of an organic acid and/or a salt thereof, 2 to 74% by weight of water, and 0.5 to 90% by weight of an organic solvent, wherein a pH of the stripping composition is less than 8; and a method of stripping a resist from a substrate, comprising applying one of the stripping composition to the substrate.

9 Claims, No Drawings

STRIPPING COMPOSITION FOR RESIST

BACKGROUND OF THE INVENTION

1. Field of the Invention

The present invention relates to a stripping composition for a resist (hereinafter simply referred to as "stripping composition"), and more specifically to a liquid stripping composition for stripping a resist in the lithography in technical fields such as semiconductor devices and LCD.

2. Discussion of the Related Art

In the production of semiconductor devices, LCD, and the like, there has been employed a process of completely stripping the resist comprising forming a conductive film or insulating film onto a substrate by PVD (physical vapor deposition) or CVD (chemical vapor deposition); forming the desired patterns for resist on a thin film by lithography; and selectively etching the lower layer portion of the thin film as an etching resist to strip the formed patterns. In this process, the amine compounds are often used as a stripper.

However, as the integration rate of the semiconductor devices is increased, in order to further improve the working accuracy of the substrate after the formation of the resist film, there has been generally developed to raise the post-baking temperature of the resist film after development or to implement working techniques such as plasma etching, reactive ion etching (RIE treatment), and ion implantation. Therefore, it has been extremely difficult to strip with the conventional stripper the resist film which is modified or hardened owing to the high-energy treatments applied.

In addition, in the stripper comprising the amine stripper, when the content of the amine compound or water is high, the pH of the stripper becomes high, so that the corrosion against a metal wiring or metal thin film of aluminum or tungsten on a substrate is likely to take place, thereby having a defect that the metal surface is faded or dissolved.

As a stripper for solving these defects, there have been proposed, for instance, a stripping composition prepared by adding a carboxyl group-containing organic compound to a nitrogen-containing organic hydroxy compound, which is an amine compound (Japanese Patent Laid-Open No. Hei 7-219240); a stripping composition comprising an organic acid such as acetic acid, lactic acid, or hydroxyacetatic acid, benzyl alcohols, and 75 to 99% by weight of water as essential components (Japanese Patent Laid-Open No. Hei 4-361265). In any of the above stripping compositions, the stripping ability and the capability of preventing corrosion are insufficient.

An object of the present invention is to provide a stripper composition having excellent stripping ability even against a modified or hardened resist by applying high-energy treatment, and excellent capability of preventing corrosion against various parts such as metal wiring or metal thin films on semiconductor devices and LCD, and a method for stripping a resist therewith.

This and other objects of the present invention will be apparent from the following description.

SUMMARY OF THE INVENTION

The present invention pertains to:
[1] a stripping composition for a resist comprising a polycarboxylic acid and/or a salt thereof, and water, wherein a pH of the stripping composition is less than 8;
[2] a stripping composition for a resist comprising:
  0.01 to 90% by weight of an organic acid and/or a salt thereof,
  2 to 74% by weight of water, and
  0.5 to 90% by weight of an organic solvent,
  wherein a pH of the stripping composition is less than 8; and
[3] a method of stripping a resist from a substrate, comprising applying the stripping composition of item [1] or [2] to the substrate.

DETAILED DESCRIPTION OF THE INVENTION

The stripping composition for a resist of the present invention can exhibit excellent stripping ability by the use of a polycarboxylic acid or a salt thereof and water. In this case, an organic solvent may be further added thereto, whereby a more remarkable stripping effect can be achieved. The synergistic effect with the organic solvent mentioned above is not limited to a polycarboxylic acid or a salt thereof, and organic acids such as monocarboxylic acids are included, and a more excellent stripping ability is exhibited by the addition of a desired amount. In addition, in the composition of the present invention, a stripping composition for a resist having excellent capability of preventing corrosion by further adding a compound containing Si atom in a molecule.

Therefore, the preferred embodiments of the stripping composition for a resist of the present invention can be roughly classified into two embodiments:

[Embodiment a] a stripping composition comprising a polycarboxylic acid and/or a salt thereof and water, preferably further comprising an organic solvent and/or a compound containing Si atom in a molecule, wherein the pH of the stripping composition is less than 8; and

[Embodiment b] a stripping composition comprising 0.01 to 90% by weight of an organic acid and/or a salt thereof and 2 to 74% by weight of water, and 0.5 to 90% by weight of an organic solvent, preferably further comprising a compound containing Si atom in a molecule, wherein the pH of the stripping composition is less than 8.

It is preferable that the polycarboxylic acid used in Embodiment a is represented by the formula (I):

wherein $R^1$ is linear, branched or cyclic, saturated or unsaturated hydrocarbon group having 1 to 20 carbon atoms, which may have 1 to 5 oxygen atoms, nitrogen atoms or sulfur atoms, and hydrogen atom bound to a carbon atom of $R^1$ may be substituted by —OH group, —NH$_2$ group, —SH group or —NO$_2$ group; one or more —COOH groups may be bound to the same carbon atom in $R^1$; p is 0 or 1; q is an integer of from 1 to 40; r is an integer of from 1 to 3; a sum of q and r is 3 or more; B is absent or is —O—group, —CO—group, —NH— group, —group — or

group.

In the formula (I), $R^1$ is more preferably a hydrocarbon group having 1 to 10 carbon atoms, and particularly preferably a linear, saturated hydrocarbon group having 1 to 4 carbon atoms. q is more preferably an integer of from 1 to 5, particularly preferably 1 or 2, from the viewpoint of the ability of stripping the resist.

Concrete examples of the polycarboxylic acid represented by the formula (I) include saturated polycarboxylic acids, such as oxalic acid, malonic acid, methylmalonic acid, ethylmalonic acid, dimethylmalonic acid, succinic acid, methylsuccinic acid, 2,2-dimethylsuccinic acid, glutaric acid, adipic acid, 3-methyladipic acid, sebacic acid, hexadecanedionic acid, 1,2,3-propanetricarboxylic acid, 1,2,3,4-butanetetracarboxylic acid, polyacrylic acids, and polymaleic acids; unsaturated polycarboxylic acids such as maleic acid, fumaric acid, citraconic acid, mesaconic acid, cis-aconitic acid, and trans-aconitic acid; hydroxypolycarboxylic acids such as tartaric acid, malic acid, and citric acid; aminopolycarboxylic acids such as aspartic acid and glutamic acid; polycarboxylic acids having an aromatic ring such as terephthalic acid, trimellitic acid, and naphthoic acid; polycarboxylic acids having an alicyclic ring such as 1,2-cyclohexanedicarboxylic acid; polycarboxylic acids having a heterocyclic ring such as 2,3-pyrazinedicarboxylic acid, and the like. Among them, from the viewpoint of the ability of stripping a resist, saturated polycarboxylic acids, such as oxalic acid, malonic acid, succinic acid, glutaric acid, adipic acid, polyacrylic acids, and polymaleic acids; hydroxypolycarboxylic acids such as tartaric acid, malic acid, and citric acid; and aminopolycarboxylic acids such as aspartic acid and glutamic acid are particularly preferable.

The dissociation index $pK_1$ at first step of the polycarboxylic acid is preferably 3.6 or less, more preferably from 1 to 3, from the viewpoint of the ability of stripping a resist.

Here, the dissociation index $pK_1$ at the first step of the polycarboxylic acid is calculated as follows. Specifically, the polycarboxylic acid (represented by $H_nA$ as the general formula), when dissolved in water, is stepwise dissociated as follows:

First Step $H_nA \rightleftharpoons H_{n-1}A^- + H^+$

Second Step $H_{n-1}A^- \rightleftharpoons H_{n-2}A^{2-} + H^+$ n-th Step $HA^{(n-1)-} \rightleftharpoons A^{n-} + H^+$ Here, the dissociation constant ($K_1$) at the first step is defined as follows:

$$K_1 = \frac{[H_{n-1}A^-][H^+]}{[H_nA]}$$

The logarithm of a reciprocal of $K_1$ found herein is referred to as the dissociation index ($pK_1$).

$pK_1 = \log(1/K_1) = -\log K_1$

In addition, in the present specification, $pK_1$ in the case of using a salt of a polycarboxylic acid means $pK_1$ of a polycarboxylic acid.

The salt of the polycarboxylic acid includes salts obtained from a polycarboxylic acid and a basic organic compound or basic inorganic compound. The basic organic compound includes primary amines, secondary amines, tertiary amines, imines, alkanol amines, amides, basic heterocyclic compounds, quaternary ammonium hydroxides, and the like. The basic inorganic compound includes ammonia, sodium hydroxide, potassium hydroxide, calcium hydroxide, and the like. Among them, from the viewpoint of avoiding inclusion of metal ions, the ammonium salts of the polycarboxylic acids and salts obtained from polycarboxylic acids and basic organic compounds are preferable. The salts of the polycarboxylic acids may be used alone or in admixture of two or more compounds.

In addition, the polycarboxylic acid and/or a salt thereof may be used alone or in admixture of two or more compounds.

The content of the polycarboxylic acid and/or a salt thereof in the stripping composition is preferably from 0.01 to 90% by weight, more preferably from 0.05 to 85% by weight, still more preferably from 0.1 to 70% by weight. In addition, it is desirable that the above content is 0.01% by weight or more, from the viewpoint of obtaining an excellent ability of stripping the resist, and that the content is 90% by weight or less, from the viewpoint of containing an appropriate amount of water.

Water used in Embodiment a is preferably those in which the amounts of ionic substances, particles, and the like are extremely reduced, including, for instance, ion-exchanged water, pure water, and ultrapure water, in consideration of the application of the stripping composition in the production field of semiconductor devices and LCD.

The water content in the stripping composition of Embodiment a is preferably from 10 to 99.99% by weight, more preferably from 15 to 99.95% by weight, still more preferably from 30 to 99.9% by weight. In addition, it is desirable that the above content is 10% by weight or more, from the viewpoint of obtaining an excellent ability of stripping the resist, and that the content is 99.99% by weight or less, from the viewpoint of containing an appropriate amount of the polycarboxylic acid and/or a salt thereof.

It is required that the pH of the stripping composition of Embodiment a is less than 8. One of the large features of this Embodiment a and Embodiment b detailed below also resides in that the pH of the stripping composition is less than 8. Since the pH is adjusted to less than 8, the ability of stripping the resist becomes sufficient, and consequently there can be exhibited excellent effects that the stripping composition can contribute to the improvements in productivity and quality of the resulting semiconductor devices. Therefore, when the pH of the stripping composition is 8 or more, excellent ability of stripping the resist or excellent capability of preventing corrosion against metal materials cannot be obtained, even in a case where the stripping composition comprises (1) a polycarboxylic acid and/or a salt thereof, and water, or a case where the stripping composition comprises (2) 0.01 to 90% by weight of an organic acid and/or a salt thereof and 2 to 74% by weight of water, and 0.5 to 90% by weight of an organic solvent. The pH of the stripping composition of this Embodiment a is less than 8, preferably from 0.1 to 7, more preferably from 0.3 to 5, still more preferably from 0.5 to 3, from the viewpoint of obtaining an excellent ability of stripping the resist.

The stripping composition of this Embodiment a may further comprise a compound containing an Si atom in a molecule, from the viewpoint of capability of preventing corrosion against-metal materials. In the present specification, the term "a compound containing an Si atom in a molecule" refers to a compound having one or more Si atoms in one molecule, and it is preferable that the compound has 1 to 100 Si atoms, more preferably 1 to 10 Si atoms. The content of one or more Si atoms in the stripping composition of this Embodiment a can be quantified by plasma emission spectrochemical analysis. The content of the Si atoms is preferably 0.1 ppm or more and 100,000 ppm or less, more preferably 1 ppm or more and 10,000 ppm or less, still more preferably 5 ppm or more and 5,000 ppm or less, from the viewpoint of the capability of preventing corrosion.

Examples of the compound containing one or more Si atoms in a molecule include inorganic silicon compounds such as silicic acid and silicates, and organic silicon compounds containing one or more Si atoms described in *Aldrich Structure Index* (1992–1993 edition, pages 425–432). The inorganic silicon compound and the organic silicon compound are preferably those described below having Si—Y bond in a molecule.

In the Si—Y bond, Y is a halogen atom such as Cl, Br and I; an alkyl group having 1 to 20 carbon atoms, an alkoxy group having 1 to 20 carbon atoms, hydroxyl group, sulfur atom, amino group, hydrogen atom, oxygen atom or OM group. Here, M is an atom or group which is capable of forming a cation, and examples thereof include an alkali metal atom such as Li, Na and K; an alkaline earth metal atom such as Mg, Ca and Ba; ammonium ion; and primary to quaternary alkyl ammonium ions wherein 1 to 4 hydrogen atoms of the ammonium ion is substituted by a hydrocarbon group and/or hydroxyalkyl group, each having 1 to 10 carbon atoms. Among Y mentioned above, an alkoxy group or OM group is preferable, among which an alkoxy group having 1 to 6 carbon atoms is more preferable, and an alkoxy group having 1 to 2 carbon atoms is still more preferable.

In addition, the number of the Si—Y bonds in one molecule is preferably 1 to 15, more preferably 1 to 4.

The compounds having an Si—Y bond in a molecule is preferably an organic silicon compound, from the viewpoint of excellent compatibility with other ingredients in the stripping composition. The molecular weight of the organic silicon compound is preferably from 45 to 10,000, more preferably from 80 to 2,000, still more preferably from 100 to 1,000, specifically more preferably from 100 to 500. Among them, from the viewpoint of high capability of preventing corrosion, the organic silicon compounds represented by the following formulas (IV) to (VI):

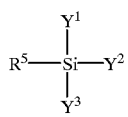

(IV)

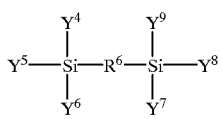

(V)

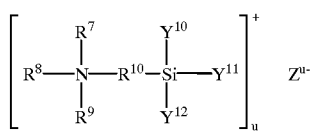

(VI)

wherein each of $R^5$ to $R^9$ is independently a hydrocarbon group having 1 to 20 carbon atoms; $R^{10}$ is a hydrocarbon group having 1 to 10 carbon atoms, wherein each of hydrocarbon groups $R^5$ to $R^{10}$ may have 1 to 5 oxygen atoms, nitrogen atoms or sulfur atoms and may be substituted by —OH group, —NH$_2$ group or —SH group, and it is preferable that the hydrocarbon groups $R^5$ to $R^{10}$ are substituted by —NH$_2$ group; and each of $Y^1$ to $Y^{12}$ is the same as defined in Y above, which may be identical or different; Z is an acid radical or hydroxy group having a valency of u, wherein u is an integer of from 1 to 3; hexamethyldisilathiane, tetramethyl orthosilicate, tetraethyl orthosilicate, 1,2-bis(trimethylsilyloxy)ethane, 1,7-dichlorooctamethyltetrasiloxane, tris(trimethylsilyl)amine, and the like. In the present specification, the term "acid radical" refers to a group of anionic atoms in which one or more hydrogen atoms capable of substituting with a metal atom or a cationic group are removed from the acid molecule.

In the formula (IV), $R^5$ is preferably a hydrocarbon group having 2 to 18 carbon atoms, more preferably a hydrocarbon group having 2 to 12 carbon atoms, still more preferably a hydrocarbon group having 2 to 8 carbon atoms. Concrete examples thereof include ethyl group, vinyl group, propyl group, isobutyl group, hexyl group, octyl group, phenyl group, and the like. In addition, each of $y^1$ to $Y^3$ is more preferably an alkoxy group having 1 to 6 carbon atoms, still more preferably an alkoxy group having 1 to 2 carbon atoms.

Concrete examples of the compound represented by the formula (IV) include alkyl trimethoxysilanes, alkyl triethoxysilanes, alkyl trihydroxysilanes, alkyl triaminosilanes, alkyl trichlorosilanes, alkyl tribromosilanes, alkyl triiodosilanes, and the like, wherein each of the alkyl moiety is exemplified by propyl, vinyl, aminopropyl, mercaptopropyl, hexyl, phenyl, decyl, phenylaminopropyl, and octadecyl. Among them, the aminoalkyl trimethoxysilanes and the aminoalkyl triethoxysilanes are more preferable, and aminopropyl trimethoxysilane and aminopropyl triethoxysilane are still more preferable.

In the formula (V), each of $Y^4$ to $Y^9$ is the same as defined in Y above, which may be identical or different. In addition, $R^6$ is preferably a hydrocarbon group having 2 to 18 carbon atoms, more preferably a hydrocarbon group having 2 to 12 carbon atoms. Concrete examples of the compound represented by the formula (V) include 1,6-bis(trimethoxysilyl)hexane, 1,6-bis(trichlorosilyl)hexane, 1,8-bis(trihydroxysilyl)octane, 1,10-bis(triaminosilyl)decane, and the like.

In the formula (VI), it is desirable that each of $R^7$, $R^8$ and $R^9$ is independently a hydrocarbon group having 6 to 18 carbon atoms. It is desirable that $R^{10}$ is a hydrocarbon group having 2 to 6 carbon atoms. Each of $Y^{10}$, $Y^{11}$ and $Y^{12}$ is the same as defined in Y above, which may be identical or different. Concrete examples of Z include acid radicals such as Cl, Br, I, $CO_3$, $HCO_3$, $NO_3$, $SO_4$, $HSO_4$, $PO_4$, $HPO_4$, and $H_2PO_4$; and OH. Among them, OH is desirable from the viewpoint of giving little affect to the insulation film or metal film.

Among the organic silicon compounds, the compounds of the formula (IV) are preferable from the viewpoint of capability of preventing corrosion.

The content of the compound having one or more Si atoms in a molecule in the stripping composition of this Embodiment a is preferably from 0.001 to 10% by weight, more preferably from 0.05 to 5% by weight, still more preferably from 0.01 to 1% by weight. The lower limit of the content is preferably 0.001% by weight or more, from the viewpoint of capability of preventing corrosion. The upper limit of the content is preferably 10% by weight or less, from the viewpoint of the stripping ability of the stripper.

In addition, the stripping composition of this Embodiment a may further comprise an organic solvent from the viewpoints of accelerating the permeation of the polycarboxylic acid and/or a salt thereof into the resist and improving the ability of stripping the resist.

The organic solvent includes one or more organic solvents selected from the group consisting of alkylene oxide compounds represented by the formula (II):

(II)

wherein $R^2$ is hydrogen atom or a hydrocarbon group having 1 to 8 carbon atoms; X is —O— group, —COO— group, —NH— group or —N((AO)$_n$H)— group; each of k and n independently is an integer of from 1 to 20; A is an alkylene group having 2 or 3 carbon atoms; $R^3$ is hydrogen atom or a hydrocarbon group having 1 to 8 carbon atoms; and m is an integer of from 1 to 8, alcohols, ethers, carbonyl compounds, esters, phenols, nitrogen-containing compounds and sulfur-containing compounds.

In the formula (II), $R^2$ is preferably hydrogen atom or a hydrocarbon group having 1 to 6 carbon atoms. $R^3$ is preferably hydrogen atom or a hydrocarbon group having 1 to 4 carbon atoms, more preferably hydrogen atom or a hydrocarbon group having 1 or 2 carbon atoms. m is preferably an integer of from 1 to 3, more preferably 1 or 2.

Concrete examples of the alkylene oxide compounds represented by (II) include ethylene glycol alkyl ethers, diethylene glycol alkyl ethers, and triethylene glycol alkyl ethers, of which each alkyl ether moiety is exemplified by methyl ether, ethyl ether, propyl ether, butyl ether, hexyl ether, phenyl ether, benzyl ether, dimethyl ether, diethyl ether, butyl methyl ether, ethyl propyl ether, butyl ethyl ether, dipropyl ether, dibutyl ether, and the like; tetraethylene glycol alkyl ethers, pentaethylene glycol alkyl ethers, hexaethylene glycol alkyl ethers, propylene glycol alkyl ethers, dipropylene glycol alkyl ethers, and tripropylene glycol alkyl ethers, of which each alkyl ether moiety is exemplified by methyl ether, ethyl ether, propyl ether, butyl ether, hexyl ether, phenyl ether, benzyl ether, dimethyl ether, diethyl ether, and the like.

The alcohols include the compounds represented by the formula (VII):

$$R^1\text{---}(OH)_m \quad\quad (VII)$$

wherein $R^1$ and m are as defined in the formula (I) and the formula (II).

The ethers include the compounds represented by the formula (VIII):

$$R^1\text{---}O\text{---}R^1 \quad\quad (VIII)$$

wherein $R^1$ is as defined in the formula (I). The compounds represented by the formula (VIII) include alkyl glyceryl ethers having 1 to 20 carbon atoms.

The carbonyl compounds include the compounds represented by the formula (IX):

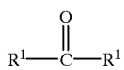
(IX)

wherein $R^1$ is as defined in the formula (I).

The esters include the compounds represented by the formula (X):

$$R^1\text{---}COOR^{11} \quad\quad (X)$$

wherein $R^1$ is as defined in the formula (I); and $R^{11}$ is a hydrocarbon group having 1 to 5 carbon atoms. Incidentally, in the formula (X), it is preferable that $R^{11}$ is an alkyl group having 1 to 3 carbon atoms.

The phenols include the compounds represented by the formula (XI):

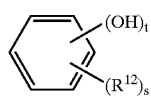
(XI)

wherein $R^{12}$ is a linear, branched, or cyclic, saturated or unsaturated hydrocarbon group having 1 to 9 carbon atoms, wherein the hydrocarbon group of $R^{12}$ may have 1 to 5 oxygen atoms, nitrogen atoms, or sulfur atoms, and wherein hydrogen atom bound to the carbon atom of $R^{12}$ may be substituted by —OH group, —$NH_2$ group, —SH group, or —$NO_2$ group; s is an integer of from 0 to 5; and t is an integer of from 1 to 3.

The nitrogen-containing compounds are not specified to particular ones, as long as the compounds contain nitrogen atom and have a molecular weight of 200 or less. The sulfur-containing compounds are not specified to particular ones, as long as the compounds contain sulfur atom and have a molecular weight of 200 or less.

Concrete examples of the organic solvent include the compounds listed in "New Edition Solvent Pocket Book" (published by K. K. Ohm on Jun. 10, 1994), Data Edit., pages 331–761). Among them, from the viewpoint of permeability, preferable are diethylene glycol monobutyl ether and diethylene glycol mondhexyl ether, which are the alkylene oxide compounds represented by the formula (II); propanol, butanol and pentanol, which are alcohols; trioxane and methylal, which are ethers; acrolein and methyl ethyl ketone, which are carbonyl compounds; nitriloacetoacetate and ethyl formate, which are esters; benzyl phenol, which is a phenol; dimethyl formamide; dimethyl acetoamide; N-methyl-2-pyrrolidone and dimethylimidazolidinone, which are nitrogen-containing compounds; and dimethyl sulfoxide and sulfolane, which are sulfur-containing compounds. These organic solvents may be used alone or in admixture of two or more compounds.

In addition, the melting point of the organic solvent is preferably 60° C. or less, more preferably 30° C. or less, still more preferably 10° C. or less, from the viewpoint of ensured ability of stripping the resist and the workability.

The organic solvent is preferably those which are capable of dissolving at an amount of 0.5% by weight or more in water at 25° C., preferably those which are capable of dissolving at an amount of 4% by weight or more, and more preferably those which are capable of dissolving at an amount of 7% by weight or more, from the viewpoint of accelerating the permeation of the polycarboxylic acid and/or a salt thereof or water into the resist, and thereby improving the ability of stripping the resist.

The content of the organic solvent in the stripping composition in this Embodiment a is preferably from 0.5 to 900 parts by weight, more preferably from 5 to 300 parts by weight, based on a total amount of 100 parts by weight of the polycarboxylic acid and/or a salt thereof and water. In addition, the content of the organic solvent is preferably 0.5 parts by weight or more, from the viewpoint of high permeation, and the content is preferably 900 parts by weight or less, from the viewpoint of an excellent ability of stripping the resist.

Next, examples of the organic acid used in Embodiment b include organic compounds including carboxylic acids, peracids, carbonic acid esters, thiocarboxylic acids, mercaptanes, sulfonic acids, sulfinic acids, sulfenic acids, sulfuric acid esters, phosphonic acids, phosphatidic acids, phosphoric acid esters, phosphines, complex compounds of boric acid esters, and the like. Among them, the carboxylic acids are preferable, from the viewpoints of the ability of stripping the resist and the ability of preventing corrosion against metal materials. The carboxylic acid includes linear, saturated monocarboxylic acids, linear, unsaturated monocarboxylic acids, branched, saturated monocarboxylic acids, branched, unsaturated monocarboxylic acids, saturated polycarboxylic acids, unsaturated polycarboxylic acids, hydroxycarboxylic acids, aminocarboxylic acids, alkoxycarboxylic acids, carboxylic acids having an aromatic ring, carboxylic acids having an alicyclic ring or heterocyclic ring, and the like.

In addition, the preferable carboxylic acid is represented by the formula (III):

wherein $R^4$ is hydrogen atom, a linear, branched or cyclic, saturated or unsaturated hydrocarbon group having 1 to 40 carbon atoms, which may have 1 to 5 oxygen atoms, nitrogen atoms or sulfur atoms, and hydrogen atom bound to a carbon atom of $R^4$ may be substituted by —OH group, —$NH_2$ group, —SH group or —$NO_2$ group; one or more —COOH groups may be bound to the same carbon atom in $R^4$; e is 0 or 1; f is an integer of from 1 to 40; g is an integer of from 1 to 3; B is absent or is —O— group, —CO— group, —NH— group, —S— group or

group.

In the formula (III), it is desirable that $R^4$ is hydrogen atom, a linear, saturated hydrocarbon group having 1 to 18 carbon atoms, a branched, saturated hydrocarbon group having 3 to 18 carbon atoms, a linear, unsaturated hydrocarbon group having 2 to 18 carbon atoms, a branched, unsaturated hydrocarbon group having 3 to 18 carbon atoms, a saturated or unsaturated, hydrocarbon group having an alicyclic ring having 3 to 18 carbon atoms, or a saturated or unsaturated, hydrocarbon group having an aromatic ring having 6 to 18 carbon atoms, from the viewpoints of the ability of stripping the resist and the ability of preventing corrosion against the metal materials. It is further desirable that $R^4$ is a linear, saturated hydrocarbon group having 1 to 12 carbon atoms, a branched, saturated hydrocarbon group having 3 to 12 carbon atoms, a linear, unsaturated hydrocarbon group having 2 to 12 carbon atoms, a branched, unsaturated hydrocarbon group having 3 to 12 carbon atoms, a saturated or unsaturated, hydrocarbon group having an alicyclic ring having 3 to 12 carbon atoms, or a saturated or unsaturated, hydrocarbon group having an aromatic ring having 6 to 12 carbon atoms. It is particularly most desirable that $R^4$ is a linear, saturated hydrocarbon group having 1 to 6 carbon atoms, a branched, saturated hydrocarbon group having 3 to 6 carbon atoms, a linear, unsaturated hydrocarbon group having 2 to 6 carbon atoms, a branched, unsaturated hydrocarbon group having 3 to 6 carbon atoms, a saturated or unsaturated, hydrocarbon group having an alicyclic ring having 3 to 6 carbon atoms, or a saturated or unsaturated, hydrocarbon group having an aromatic ring having 6 to 8 carbon atoms. In addition, when the hydrocarbon group of $R^4$ contains oxygen atom, nitrogen atom or sulfur atom, the number of each of the oxygen atoms, nitrogen atoms or sulfur atoms is more preferably 1 to 2.

In addition, in the formula (III), f is preferably an integer of from 1 to 18, more preferably from 1 to 12, still more preferably from 1 to 6, from the viewpoints of the ability of stripping the resist and the ability of preventing corrosion against the metal materials.

In Embodiment b, the carboxylic acids may be monocarboxylic acids or polycarboxylic acids, and the preferred polycarboxylic acids are the polycarboxylic acids represented by the formula (I).

Concrete examples of the carboxylic acid represented by the formula (III) include linear, saturated monocarboxylic acids having 1 to 18 carbon atoms, such as formic acid, acetic acid, and propionic acid; linear, unsaturated monocarboxylic acids, such as acrylic acid, crotonic acid, vinylacetic acid, 4-pentenoic acid, 6-heptenoic acid, 2-octenoic acid, undecylenic acid, and oleic acid; branched, saturated monocarboxylic acids, such as isobutyric acid, isovaleric acid, pivalic acid, 2-methylbutyric acid, 2-methylvaleric acid, 2,2-dimethylbutyric acid, 2-ethylbutyric acid, tert-butylbutyric acid, 2,2-dimethylpentanoic acid, 2-ethylpentanoic acid, 2-methylhexanoic acid, 2-ethylhexanoic acid, 2,4-dimethylhexanoic acid, 2-methylheptanoic acid, 2-propylpentanoic acid, 3,5,5-trimethylhexanoic acid, 2-methyloctanoic acid, 2-ethylheptanoic acid, 2-ethyl-2,3,3-trimethylbutyric acid, 2,2,4,4-tetramethylpentanoic acid, and 2,2-diisopropylpropionic acid; branched, unsaturated monocarboxylic acids, such as methacrylic acid, tiglic acid, 3,3-dimethylacrylic acid, 2,2-dimethyl-4-pentenoic acid, 2-ethyl-2-hexenoic acid, and citronellic acid; saturated polycarboxylic acids, such as oxalic acid, malonic acid, methylmalonic acid, ethylmalonic acid, dimethylmalonic acid, succinic acid, methylsuccinic acid, 2,2-dimethylsuccinic acid, glutaric acid, adipic acid, 3-methyladipic acid, sebacic acid, hexadecanedionic acid, 1,2,3-propanetricarboxylic acid, 1,2,3,4-butanetetracarboxylic acid, polyacrylic acids, and polymaleic acids; unsaturated polycarboxylic acids, such as maleic acid, fumaric acid, citraconic acid, mesaconic acid, cis-aconitic acid, and trans-aconitic acid; hydroxycarboxylic acids, such as lactic acid, gluconic acid, tartaric acid, malic acid, and citric acid; aminocarboxylic acids, such as glycine, DL-alanine, 4-aminobutyric acid, DL-3-aminobutyric acid, and sarcosine; alkoxycarboxylic acids, such as methoxyacetic acid and ethoxyacetic acid; carboxylic acids having an aromatic ring, such as benzoic acid, terephthalic acid, trimellitic acid, and naphthoic acid; carboxylic acids having an alicyclic ring, such as cyclohexanecarboxylic acid, cyclohexanepropionic acid, cyclohexanebutyric acid, and cyclopentanecarboxylic acid; and carboxylic acids having a heterocyclic ring, such as furoic acid, thenoic acid, nicotinic acid.

Among them, more preferable ones are the linear saturated monocarboxylic acids having 1 to 6 carbon atoms such as formic acid, acetic acid, and propionic acid; saturated polycarboxylic acids, such as oxalic acid, malonic acid, and succinic acid; hydroxycarboxylic acids, such as lactic acid, gluconic acid, tartaric acid, malic acid, and citric acid; aminocarboxylic acids, such as glycine, DL-alanine, 4-aminobutyric acid, DL-3-aminobutyric acid, and sarcosine; and alkoxycarboxylic acids, such as methoxyacetic acid and ethoxyacetic acid. In particular, formic acid, acetic acid, oxalic acid, malonic acid, succinic acid, lactic acid, gluconic acid, tartaric acid, malic acid, and citric acid are preferable.

The molecular weight of the carboxylic acid mentioned above is not particularly limited, and the molecular weight is preferably from 46 to 400, more preferably from 46 to 200, from the viewpoints of the ability of stripping the resist and the ability of preventing corrosion against the metal materials.

The salts of the above organic acids include salts obtained from an organic acid and a basic organic compound or a basic inorganic compound. The basic organic compound includes primary amines, secondary amines, tertiary amines, imines, alkanol amines, amides, basic heterocyclic compounds, quaternary ammonium hydroxides, and the like. The basic inorganic compound includes ammonia, sodium hydroxide, potassium hydroxide, calcium hydroxide, and the like. Among them, from the viewpoint of avoiding inclusion of metal ions, the ammonium salts of the organic acids and the salts obtained from organic acids and basic organic compounds are preferable. The salts of the organic acids may be used alone or in admixture of two or more compounds.

In addition, the organic acid and/or a salt thereof may be used alone or in admixture of two or more compounds.

The content of the organic acid and/or a salt thereof in the stripping composition of this Embodiment b is required to be from 0.01 to 90% by weight, from the viewpoint of obtaining an excellent ability of stripping the resist, and the content is preferably from 0.05 to 70% by weight, more preferably from 0.1 to 50% by weight, from the viewpoints of the ability of stripping the resist and the ability of preventing corrosion against the metal materials.

Water used in this Embodiment b may be the same as that used in Embodiment a described above. The water content in the stripping composition of this Embodiment b is required to be from 2 to 74% by weight, from the viewpoint of improving the ability of stripping the resist. One of the distinguishing features of this Embodiment b resides in that the water content is from 2 to 74% by weight. Since the water content is adjusted within the above specified range in the stripping composition, there can be exhibited an excellent ability of stripping the resist and excellent ability of preventing corrosion against the metal materials. In addition, the water content is preferably from 5 to 70% by weight, more preferably from 10 to 60% by weight, still more preferably from 15 to 50% by weight, from the viewpoints of the ability of stripping the resist and the ability of preventing corrosion against the metal materials.

The organic solvent used in this Embodiment b may be the same as that used in Embodiment a described above. The organic solvent may be used alone or in admixture of two or more compounds.

The content of the organic solvent in the stripping composition in this Embodiment b is required to be from 0.5 to 90% by weight, preferably from 5 to 80% by weight, more preferably from 10 to 50% by weight, from the viewpoints of obtaining an excellent ability of stripping the resist and high permeation ability.

The pH of the stripping composition of this Embodiment b comprising the above three essential ingredients is less than 8, preferably from 0.1 to 7, more preferably from 0.3 to 5, still more preferably from 0.5 to 3.

In addition, it is desired that the stripping composition of this Embodiment b further comprises a compound containing Si atom in a molecule. The compound containing Si atom in a molecule may be the same as those for Embodiment a described above. The content of the compound containing Si atom in a molecule in the stripping composition of this Embodiment b is preferably from 0.001 to 10% by weight, more preferably from 0.05 to 5% by weight, still more preferably from 0.01 to 1% by weight. It is desired that the lower limit of the content is 0.001% by weight or more, from the viewpoint of the ability of preventing corrosion, and that the upper limit thereof is 10% by weight or less, from the viewpoint of the ability of stripping owned by the stripper.

The stripping compositions of the present invention given in these Embodiment a and Embodiment b can be obtained by mixing the above compounds.

Since the stripping composition of the present invention described above is capable of easily stripping the resist attached to parts such as inorganic parts on semiconductor devices and LCD without damaging the those parts, the stripping composition is favorably applied to strip the resist in the production process of semiconductor devices, LCD, and the like.

Preferable examples of the methods of stripping the resist by applying the stripping composition of the present invention on a substrate by stripping the resist include a method comprising setting each piece of wafer to be treated or a plurality of wafers to be treated collectively with a jig, immersing the set wafer or wafers into the stripping composition of the present invention, and subjecting to stripping treatment with shaking the jig or giving a mechanical force such as ultrasonic wave or jet stream to the stripping composition; and a method comprising jetting or spraying the stripping composition of the present on a wafer to be treated, and subjecting to stripping treatment. The temperature of the stripping composition during this stripping treatment is preferably from 100° to 100° C., more preferably from 15° to 70° C., from the viewpoint of the workability. Incidentally, after the stripping process described above, the stripping composition remaining on the wafer is preferably removed by rinsing with a solvent such as water or isopropyl alcohol.

EXAMPLES

Examples 1 to 6, and 8 to 26 and Comparative Examples 1 to 8

An alloy film made of aluminum-silica-copper [98.5:1.0:0.5 (weight ratio)] was formed on a silicon wafer by sputtering method to provide a film thickness of about 0.5 $\mu$m. Next, a positive photoresist for naphthoquinone diazide i-line was applied on the above alloy film using a spinner. Thereafter, the wafer was pre-baked on a hot plate at 110° C. for 90 seconds to form a photoresist film having a film thickness of 1.5 $\mu$m.

This photoresist film was exposed through a photomask of a minification-type projection aligner. Thereafter, the resist film was subjected to a paddle development with the developer (aqueous solution of 2.38% tetramethylammonium hydroxide) for a predetermined period of time. The developed photoresist film was rinsed with pure water for 30 seconds, and then dried in a nitrogen gas stream. Subsequently, the resulting photoresist film was post-baked at 140° C. for 20 minutes. The metal layer at the aperture was dry-etched with chlorine gas with the above resist patterns as a mask to form a metal wire, and at the same time the residual resist was modified by hardening. Subsequently, about 70% of the residual resist was removed by dry ashing, to prepare a resist with progressed modification and hardening. This silicon wafer was used for a stripping test.

Each of the stripping composition obtained in Examples 1 to 6, and 8 to 26 and Comparative Examples 1 to 8 having the composition shown in Tables 1 to 5 was previously heated to 60° C. The silicon wafer was immersed for 20 minutes and then taken out, rinsed with isopropyl alcohol, and rinsed again with pure water. After drying, the resist patterns were magnified about 10,000 times with a scanning electron microscope, and the resist patterns of 2 $\mu$m×2 $\mu$m formed were observed at 100 locations, and the stripping ability of the resist was evaluated as a stripping ratio. In addition, in Examples 8 to 26 and Comparative Examples 3 to 8, the corrosion state of the resist patterns of the alloy wire made of aluminum-silica-copper was evaluated as a corrosion ratio. the results are shown in Tables 1 to 5. Here, the stripping ratio and the corrosion ratio were calculated by the following equations:

$$\text{Stripping Ratio} = \left[\frac{\begin{array}{c}\text{Number of resist patterns in}\\\text{which the resist was stripped}\\\text{99\% or more areally}\end{array}}{100}\right] \times 100$$

$$\text{Corrrosion Ratio} = \left[\frac{\begin{array}{c}\text{Number of resist patterns in}\\\text{which stains and pitting}\\\text{corrosion were found}\end{array}}{100}\right] \times 100$$

In addition, in Tables 1 to 4, "∞" of the dissolution of water means that water and the organic solvent can be mixed unlimitedly, and the properties of the organic solvents used in Examples 14 and 15 are the properties of the two kinds of the mixed solvent. In addition, in Table 4, "Si Atom-Containing Compound" refers to a compound containing Si atoms in a molecule.

TABLE 1

| | Example Nos. | | | | | |
|---|---|---|---|---|---|---|
| | 1 | 2 | 3 | 4 | 5 | 6 |
| Composition of Stripping Composition (% by weight) | | | | | | |
| Polycarboxylic Acid and/or Salt Thereof ($pK_1$) | | | | | | |
| Oxalic Acid (1.04) | 3 | | | | | 1 |
| Malonic Acid (2.65) | | 10 | | | | 5 |
| Ammonium Oxalate (1.04*) | | | 2 | | | |
| Tartaric Acid (2.82) | | | | 30 | | |
| Aspartic Acid (1.93) | | | | | 3 | |
| Water | 97 | 90 | 98 | 50 | 48 | 50 |
| Organic Solvent [melting point, dissolubility to water (% by weight)] | | | | | | |
| Dimethyl Formamide [<0° C., ∞] | | | | | 49 | |
| Dimethyl Sulfoxide [<0° C., ∞] | | | | | | 44 |
| Diethylene Glycol Monobutyl Ether [18° C., ∞] | | | | 20 | | |
| pH of Stripping Composition | 1.4 | 1.5 | 6.8 | 0.5 | 4.7 | 1.3 |
| Evaluation Stripping Ratio (%) | 95 | 93 | 85 | 100 | 89 | 100 |

Note *: $pK_1$ of oxalic acid.

TABLE 2

| | Comp. Ex. Nos. | |
|---|---|---|
| | 1 | 2 |
| Composition of Stripping Composition (% by weight) | | |
| Monoethanol Amine | 30 | 80 |
| Carboxylic Acid ($pK_1$) | | |
| Benzoic Acid (4.00) | 3 | |
| Succinic Acid (4.00) | | 5 |
| Water | | 5 |
| Organic Solvent [melting point, dissolubility to water (% by weigt)] | | |
| N-Methyl-2-pyrrolidone [<0° C., ∞] | | 10 |
| Diethylene Glycol Monobutyl Ether [<0° C., ∞] | 67 | |
| pH of Stripping Composition | 12.6 | 13.6 |
| Evaluation Stripping Ratio (%) | 20 | 25 |

It is clear from the results in Tables 1 and 2 that any one of the stripping compositions obtained in Examples 1 to 6 had high stripping ratios as compared with the stripping compositions obtained in Comparative Examples 1 and 2.

Example 7

The stripping composition obtained in Example 1 was used to evaluate the stripping ratio in the same manner as in Example 1 except that the stripping temperature was 25° C. and the stripping time was 5 minutes. As a result, the stripping ratio was favorably high as 95%.

TABLE 3

| | Example Nos. | | | | |
|---|---|---|---|---|---|
| | 8 | 9 | 10 | 11 | 12 |
| Composition of Stripping Composition (% by weight) | | | | | |
| (a) Organic Acid and/or Salt Thereof | | | | | |
| Acetic Acid | 10 | 30 | | | |
| Oxalic Acid | | | 3 | | |
| Malonic Acid | | | | 10 | |
| Lactic Acid | | | | | 0.5 |
| Tartaric Acid | | | | | |
| Benzoic Acid | | | | | |
| Ammonium Oxalate | | | | | |
| Aminotrimethylenephosphonic acid | | | | | |
| (b) Water | 50 | 10 | 70 | 40 | 50 |
| (c) Organic Solvent | | | | | |
| Dimethylformamide | 40 | | | | |
| N-Methyl-2-pyrroldione | | | | 50 | |
| Dimethyl sulfoxide | | | | | 49.5 |
| Diethylene Glycol Monobutyl Ether | | 60 | 27 | | |
| Diethylene Glycol Monohexyl Ether | | | | | |
| Physical Properties of (c) Organic Solvents | | | | | |
| Melting Point (° C.) | <0 | <0 | <0 | <0 | 18 |
| Dissolubility to Water (% by wt) | ∞ | ∞ | ∞ | ∞ | ∞ |
| pH of Stripping Composition | 2.5 | 1.7 | 1.4 | 1.5 | 3.5 |
| Evaluation | | | | | |
| Stripping Ratio (%) | 100 | 85 | 100 | 98 | 85 |
| Corrosion Ratio (%) | 0 | 0 | 12 | 1 | 0 |

| | Example Nos. | | | | |
|---|---|---|---|---|---|
| | 13 | 14 | 15 | 16 | 17 |
| Composition of Stripping Composition (% by weight) | | | | | |
| (a) Organic Acid and/or Salt Thereof | | | | | |
| Acetic Acid | | | 10 | | |
| Oxalic Acid | | | | | |
| Malonic Acid | | | | | |
| Lactic Acid | | 1 | | | |
| Tartaric Acid | 60 | | | | |
| Benzoic Acid | | 10 | | | |
| Ammonium Oxalate | | | | 1 | |
| Aminotrimethylenephoshonic acid | | | | | 1 |
| (b) Water | 35 | 30 | 3 | 50 | 50 |
| (c) Organic Solvent | | | | | |
| Dimethylformamide | | | 30 | | |
| N-Methyl-2-pyrrolidone | | | | 49 | |
| Dimethyl sulfoxide | | | | | 49 |
| Diethylene Glycol Monobutyl Ether | 5 | 30 | 56 | | |
| Diethylene Glycol Monohexyl Ether | | 30 | | | |
| Physical properties of (c) Organic Solvents | | | | | |
| Melting Point (° C.) | <0 | <0 | <0 | <0 | 18 |

TABLE 3-continued

| | | | | | |
|---|---|---|---|---|---|
| Dissolubility to Water (% by wt) | ∞ | 10 | ∞ | ∞ | ∞ |
| pH of Stripping Composition | 0.2 | 3.0 | 2.2 | 6.5 | 1.9 |
| Evaluation | | | | | |
| Stripping Ratio (%) | 100 | 95 | 87 | 85 | 93 |
| Corrosion Ratio (%) | 7 | 0 | 0 | 0 | 0 |

TABLE 4

| | Example Nos. | | | | |
|---|---|---|---|---|---|
| | 18 | 19 | 20 | 21 | 22 |
| Composition of Stripping Composition (% by weight) | | | | | |
| (a) Organic Acid | | | | | |
| Acetic Acid | 10 | 30 | | | |
| Oxalic Acid | | | 3 | | |
| Malonic Acid | | | | 10 | |
| Tartaric Acid | | | | | 60 |
| (b) Water | 50 | 10 | 69.9 | 40 | 35 |
| (c) Organic Solvent | | | | | |
| Dimethylformamide | 39.99 | | | | |
| N-Methyl-2-pyrrolidone | | | | 49.95 | |
| Diethylene Glycol Monobutyl Ether | | 59.9 | 27 | | 4.9 |
| (d) Si Atom-Containing Compound | | | | | |
| Vinyl trimethoxysilane | 0.01 | 0.1 | 0.1 | 0.05 | 0.1 |
| 1,6-Bis(trimethoxysilyl)hexane | | | | | |
| Phenyltriaminosilane | | | | | |
| Aminopropyltrimethoxysilane | | | | | |
| Silicic Acid | | | | | |
| Physical properties of (c) Organic Solvents | | | | | |
| Melting Point (° C.) | <0 | <0 | <0 | <0 | <0 |
| Dissolubility to Water (% by wt) | ∞ | ∞ | ∞ | ∞ | ∞ |
| pH of Stripping Composition | 2.5 | 1.7 | 1.4 | 1.5 | 0.2 |
| Evaluation | | | | | |
| Stripping Ratio (%) | 100 | 85 | 100 | 98 | 100 |
| Corrosion Ratio (%) | 0 | 0 | 6 | 0 | 5 |

| | Example Nos. | | | |
|---|---|---|---|---|
| | 23 | 24 | 25 | 26 |
| Composition of Stripping Composition (% by weight) | | | | |
| (a) Organic Acid | | | | |
| Acetic Acid | | | | |
| Oxalic Acid | 3 | 3 | | |
| Malonic Acid | | | | |
| Tartaric Acid | | | 60 | 60 |
| (b) Water | 69.9 | 69.9 | 35 | 30 |
| (c) Organic Solvent | | | | |
| Dimethylformamide | | | | |
| N-Methyl-2-pyrrolidone | | | | |
| Diethylene Glycol Monobutyl Ether | 27 | 27 | 4.99 | 5 |
| (d) Si Atom-Containing Compound | | | | |
| Vinyl trimethoxysilane | | | | |
| 1,6-Bis-(trimethoxysilyl)hexane | 0.1 | | | |
| Phenyltriaminosilane | | | 0.01 | |
| Aminopropyltrimethoxysilane | | 0.1 | | |
| Silicic Acid | | | | 5 |
| Physical properties of (c) Organic Solvents | | | | |
| Melting Point (° C.) | <0 | <0 | <0 | <0 |
| Dissolubility to Water (% by wt) | ∞ | ∞ | ∞ | ∞ |
| pH of Stripping Composition | 1.4 | 1.4 | 0.2 | 0.2 |

TABLE 4-continued

| | | | | |
|---|---|---|---|---|
| Evaluation | | | | |
| Stripping Ratio (%) | 100 | 100 | 100 | 100 |
| Corrosion Ratio (%) | 6 | 0 | 4 | 5 |

TABLE 5

| | Comparative Example Nos. | | | | | |
|---|---|---|---|---|---|---|
| | 3 | 4 | 5 | 6 | 7 | 8 |
| Composition of Stripping Composition (% by weight) | | | | | | |
| Monoethanolamine | 70 | | 30 | | | |
| Ethylaminoethanol | | 89 | | | | |
| (a) Organic Acid and/or Salt Thereof | | | | | | |
| Phthalic Acid | 3 | | | | | |
| Acetic Acid | | | | | 0.5 | |
| Lactic Acid | | | | 1.5 | | |
| Benzoic Acid | | | | | 3 | |
| Monoethanolamine acetate | | | | | | 3 |
| (b) Water | | 5 | | 80 | 94.5 | 30 |
| (c) Organic Solvent | | | | | | |
| Dimethyl sulfoxide | 27 | | | | | 67 |
| Diethylene Glycol Monobutyl Ether | | | 67 | 18.5 | | |
| Benzyl Alcohol | | | | | 5 | |
| Others | | | | | | |
| Benzotriazole | | 1 | | | | |
| Pyrocatechol | | 10 | | | | |
| pH of Stripping Composition | 13.5 | 13.9 | 12.6 | 2.7 | 3.5 | 8.7 |
| Evaluation | | | | | | |
| Stripping Ratio (%) | 15 | 35 | 3 | 85 | 85 | 50 |
| Corrosion Ratio (%) | 70 | 80 | 20 | 70 | 45 | 0 |

It is clear from the results in Tables 3 to 5 that any one of the stripping compositions obtained in Examples 8 to 26 had high stripping ratios and low corrosion ratios as compared with the stripping compositions obtained in Comparative Examples 3 to 8.

In addition, the stripping composition obtained in Example 8 was used to evaluate the stripping ratio and the corrosion ratio in the same manner as in Example 8 except that the resulting silicon wafer was directly rinsed with pure water. As a result, there were obtained favorable results that the stripping ratio was 100%, and the corrosion ratio was 0%.

In addition, the stripping composition obtained in Example 10 was used to evaluate the stripping ratio and the corrosion ratio in the same manner as in Example 8 except that the stripping temperature was 25° C. and the stripping time was 5 minutes. As a result, there were obtained favorable results that the stripping ratio was 100%, and the corrosion ratio was 0%.

In addition, the corrosion suppression effect is further improved by the presence of the compound containing Si atom in a molecule, from the comparison of Examples 20, 22 to 26, in which the compound containing Si atom in a molecule is present, with Examples 10 and 13 where no such compounds exist.

The stripping composition for a resist of the present invention can easily strip a resist modified by applying high-energy treatment in a short period of time, and the corrosion against the wire materials such as aluminum and tungsten can be suppressed. As a result, the stripping composition can contribute greatly to the improvements in productivity and quality of semiconductor devices, LCD, and the like. In addition, according to the present invention, there can be exhibited an effect that the resist modified by applying high-energy treatment can be stripped easily and in a short period of time.

What is claimed is:

1. A stripping composition for a resist, comprising:
   a stripping agent, which is a polycarboxylic acid or a salt thereof;
   an organic silicon compound; and
   water,
   wherein the stripping composition has a pH of less than 8.

2. The stripping composition according to claim 1, wherein the polycarboxylic acid is a compound represented by the formula (I):

$$B-[(R^1)_p-(COOH)_q]_r \quad (I)$$

wherein $R^1$ is a linear, branched or cyclic, saturated or unsaturated hydrocarbon group having 1 to 20 carbon atoms, which may have 1 to 5 oxygen atoms, nitrogen atoms or sulfur atoms, and hydrogen atom bound to a carbon atom of $R^1$ may be substituted by —OH group, —NH$_2$ group, —SH group or —NO$_2$ group; one or more —COOH groups may be bound to the same carbon atom in $R^1$; p is 0 or 1; q is an integer of from 1 to 40; r is an integer of from 1 to 3; a sum of q and r is 3 or more; B is absent or is —O— group, —CO— group, —NH— group, —S— group or

group.

3. The stripping composition according to claim 1, wherein the polycarboxylic acid has a dissociation index pK$_1$ at the first step of 3.6 or less.

4. The stripping composition according to claim 1, further comprising one or more organic solvents selected from the group consisting of alkylene oxide compounds represented by the formula (II):

$$R^2[(X)(AO)_kR^3]_m \quad (II)$$

wherein $R^2$ is hydrogen atom or a hydrocarbon group having 1 to 8 carbon atoms; X is —O— group, —COO— group, —NH— group or —N((AO)$_n$H)— group; each of k and n independently is an integer of from 1 to 20; A is an alkylene group having 2 or 3 carbon atoms; $R^3$ is hydrogen atom or a hydrocarbon group having 1 to 8 carbon atoms; and m is an integer of from 1 to 8, alcohols, ethers, carbonyl compounds, esters, phenols, nitrogen-containing compounds and sulfur-containing compounds.

5. The stripping composition according to claim 1, wherein said salt is selected from the group consisting of ammonium salts of polycarboxylic acids and salts formed from the reaction of a polycarboxylic acid and a basic compound.

6. The stripping composition according to claim 1, wherein said stripping agent is contained in an amount of 0.1 to 70% by weight.

7. The stripping composition according to claim 1, wherein said organic silicon compound is selected from the group consisting of the compounds represented by formulas (IV) to (VI):

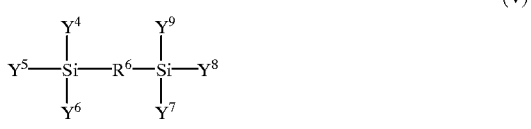

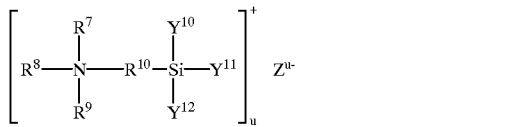

wherein each of $R^5$ to $R^9$ is independently a hydrocarbon group having 1 to 20 carbon atoms, $R^{10}$ is a hydrocarbon group having 1 to 10 carbon atoms, wherein each of the hydrocarbon groups $R^5$ to $R^{10}$ may have 1 to 5 oxygen atoms, nitrogen atoms or sulfur atoms and may be substituted by —OH group, —NH$_2$ group or —SH group;

each of $Y^1$ to $Y^{12}$, which may be identical or different, is a halogen atom; an alkyl group having 1 to 20 carbon atoms, an alkoxy group having 1 to 20 carbon atoms, a hydroxyl group, a sulfur atom, an amino group, a hydrogen atom, an oxygen atom or an OM group, wherein M is an atom or group which is capable of forming a cation; and Z is an acid radical or hydroxy group having a valence of u, wherein u is an integer of from 1 to 3.

8. The stripping composition according to claim 1, wherein said organic silicon compound is contained in an amount of from 0.01 to 1% by weight.

9. The stripping composition according to claim 7, wherein said organic silicon compound is contained in an amount of form 0.01 to 1% by weight.

* * * * *